(12) United States Patent
Arii et al.

(10) Patent No.: US 10,034,371 B2
(45) Date of Patent: Jul. 24, 2018

(54) RESIN COMPOSITION FOR PRINTED WIRING BOARD, PREPREG, METAL FOIL-CLAD LAMINATE, RESIN COMPOSITE SHEET, AND PRINTED WIRING BOARD

(71) Applicant: MITSUBISHI GAS CHEMICAL COMPANY, INC., Tokyo (JP)

(72) Inventors: Kenji Arii, Okayama (JP); Takashi Kobayashi, Tokyo (JP); Masanobu Sogame, Tokyo (JP); Yoshinori Mabuchi, Tokyo (JP); Sotaro Hiramatsu, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 115 days.

(21) Appl. No.: 15/112,251

(22) PCT Filed: Feb. 3, 2015

(86) PCT No.: PCT/JP2015/053017
§ 371 (c)(1),
(2) Date: Jul. 18, 2016

(87) PCT Pub. No.: WO2015/119121
PCT Pub. Date: Aug. 13, 2015

(65) Prior Publication Data
US 2016/0345433 A1    Nov. 24, 2016

(30) Foreign Application Priority Data

Feb. 4, 2014    (JP) .................................. 2014-019555

(51) Int. Cl.
| | | |
|---|---|---|
| *H05K 1/03* | (2006.01) | |
| *B32B 15/092* | (2006.01) | |
| *B32B 27/04* | (2006.01) | |
| *B32B 27/38* | (2006.01) | |
| *C08G 59/18* | (2006.01) | |
| *C08L 63/00* | (2006.01) | |
| *C08J 5/24* | (2006.01) | |
| *B32B 27/20* | (2006.01) | |
| *C08K 3/36* | (2006.01) | |
| *C08K 5/315* | (2006.01) | |
| *H05K 3/02* | (2006.01) | |

(52) U.S. Cl.
CPC ......... *H05K 1/0373* (2013.01); *B32B 15/092* (2013.01); *B32B 27/20* (2013.01); *C08J 5/24* (2013.01); *C08K 3/36* (2013.01); *C08K 5/315* (2013.01); *H05K 1/0366* (2013.01); *B32B 2307/306* (2013.01); *B32B 2307/3065* (2013.01); *B32B 2307/726* (2013.01); *B32B 2457/08* (2013.01); *C08J 2363/00* (2013.01); *H05K 3/022* (2013.01)

(58) Field of Classification Search
CPC .. H05K 1/0353; H05K 1/0366; H05K 1/0373; C08L 63/00; C08G 59/18; B32B 15/092; B32B 27/04; B32B 27/38
USPC ...... 428/297.4, 413, 416, 418, 901; 523/400
See application file for complete search history.

(56) References Cited

U.S. PATENT DOCUMENTS

| | | | |
|---|---|---|---|
| 4,931,545 A | 6/1990 | Shimp et al. | |
| 2009/0137725 A1 | 5/2009 | Murata et al. | |

FOREIGN PATENT DOCUMENTS

| | | | |
|---|---|---|---|
| CN | 1477136 | 2/2004 | |
| JP | 6-271669 | 9/1994 | |
| JP | 11-124433 | 5/1999 | |
| JP | 3081996 | 6/2000 | |
| JP | 2000-191776 | 7/2000 | |
| JP | 2004-175925 | 6/2004 | |
| JP | 2004-182850 A * | 7/2004 | ................ C08J 5/24 |
| JP | 2013-108025 | 6/2013 | |
| JP | 2014-19815 | 2/2014 | |

OTHER PUBLICATIONS

Machine translation of JP 2004-182850 A (no date).*
Search Report issued in Japanese Patent Application No. PCT/JP2015/053017, dated Mar. 3, 2015.
International Preliminary Report on Patentability issued in PCT/JP2015/053017, dated Aug. 9, 2016.

* cited by examiner

*Primary Examiner* — Michael J Feely
(74) *Attorney, Agent, or Firm* — Greenblum & Bernstein, P.L.C.

(57) ABSTRACT

A resin composition for a printed wiring board including:
a cyanate compound represented by the following general formula (1); and
an epoxy resin,

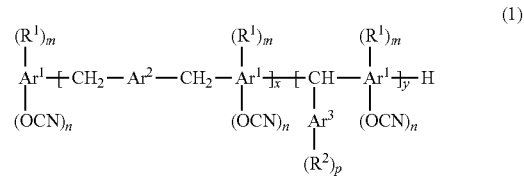

13 Claims, No Drawings

RESIN COMPOSITION FOR PRINTED WIRING BOARD, PREPREG, METAL FOIL-CLAD LAMINATE, RESIN COMPOSITE SHEET, AND PRINTED WIRING BOARD

TECHNICAL FIELD

The present invention relates to a resin composition for a printed wiring board, a prepreg, a metal foil-clad laminate, a resin composite sheet, and a printed wiring board.

BACKGROUND ART

In recent years, higher integration and miniaturization of semiconductors widely used in electronic equipment, communication instruments, personal computers, and the like have accelerated increasingly. With this, various characteristics required of laminates for semiconductor packages used in printed wiring boards have become increasingly strict. Examples of the required characteristics include characteristics such as low water absorbency, heat resistance after moisture absorption, flame retardancy, a low dielectric constant, a low dielectric loss tangent, a low thermal expansion coefficient, heat resistance, and chemical resistance. But, these required characteristics have not always been satisfied so far.

Conventionally, as resins for printed wiring boards having excellent heat resistance and electrical characteristics, cyanate compounds are known, and a resin composition using a bisphenol A-based cyanate compound and another thermosetting resin and the like is widely used for printed wiring board materials and the like. The bisphenol A-based cyanate compound has characteristics excellent in electrical characteristics, mechanical characteristics, chemical resistance, and the like but may be insufficient in low water absorbency, heat resistance after moisture absorption, and flame retardancy, and therefore for the purpose of further improving characteristics, various cyanate compounds having different structures are studied.

As a resin having a structure different from the bisphenol A-based cyanate compound, a novolac-based cyanate compound is often used (for example, see Patent Literature 1), but there are problems such as the novolac-based cyanate compound being likely to be insufficiently cured, and the water absorption rate of the obtained cured product being high and the heat resistance after moisture absorption decreasing. As a method for improving these problems, prepolymerization of a novolac-based cyanate compound and a bisphenol A-based cyanate compound is proposed (for example, see Patent Literature 2).

In addition, as a method for improving flame retardancy, a halogen-based compound being contained in a resin composition by using a fluorinated cyanate compound or mixing or prepolymerizing a cyanate compound and a halogen-based compound is proposed (for example, see Patent Literatures 3 and 4).

CITATION LIST

Patent Literature

[Patent Literature 1] Japanese Patent Laid-Open No. H11-124433
[Patent Literature 2] Japanese Patent Laid-Open No. 2000-191776
[Patent Literature 3] Japanese Patent No. 3081996
[Patent Literature 4] Japanese Patent Laid-Open No. H6-271669

SUMMARY OF INVENTION

Technical Problem

However, in Patent Literature 2, the curability is improved by prepolymerization, but a problem is that characteristics improvements in low water absorbency and heat resistance after moisture absorption are still insufficient.

In addition, in Patent Literatures 3 and 4, a halogen-based compound is used, and therefore a harmful substance such as dioxin may be generated during combustion. Therefore, it is required to improve flame retardancy without comprising a halogen-based compound.

The present invention has been made in view of the above problems, and an object of the present invention is to provide a resin composition that can realize a printed wiring board having excellent low water absorbency, heat resistance after moisture absorption, and flame retardancy, and a prepreg, a metal foil-clad laminate, a resin composite sheet, and a printed wiring board using the same.

Solution to Problem

The present inventors have diligently studied the above problems and, as a result, found that a resin composition containing a cyanate compound represented by the following general formula (1) can solve the above problems, arriving at the present invention.

Specifically, the present invention is as follows.

[1]
A resin composition for a printed wiring board comprising:
a cyanate compound (A) represented by the following general formula (1); and
an epoxy resin (B),

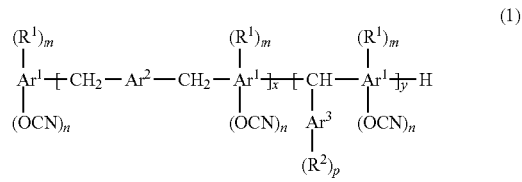

wherein $Ar^1$ represents an aryl group, $Ar^2$ each independently represents a divalent substituent selected from the group consisting of a phenylene group, a naphthylene group, and a biphenylene group, $Ar^3$ each independently represents a p+1-valent substituent selected from the group consisting of a p+1-valent phenyl group, a p+1-valent naphthyl group, and a p+1-valent biphenyl group, $R^1$ each independently represents a monovalent substituent selected from the group consisting of a hydrogen atom, an alkyl group, and an aryl group, $R^2$ each independently represents a monovalent substituent selected from the group consisting of a hydrogen atom, an alkyl group, an aryl group, and a cyanato group, n represents number of cyanato groups bonded to $Ar^1$ and is an integer of 1 to 3, m represents number of $R^1$ bonded to $Ar^1$, n+m+2 is equal to or less than number of possible bonds to $Ar^1$, p represents number of $R^2$ bonded to $Ar^3$ and is an integer of 1 to 9, x and y represent a ratio of repeating units, x is 1, whereas y is 0.25 to 2.0, and the repeating units for x and y may each be continuously arranged or may be alternately or randomly arranged with each other.

[2]

The resin composition for the printed wiring board according to the above [1], wherein $Ar^1$ comprises an m+n+1-valent or m+n+2-valent phenyl group or an m+n+1-valent or m+n+2-valent biphenyl group, $Ar^2$ comprises a phenylene group or a biphenylene group, and $Ar^3$ comprises a p+1-valent phenyl group or a p+1-valent biphenyl group.

[3]

The resin composition for the printed wiring board according to the above [1] or [2], wherein $Ar^1$ comprises an m+n+1-valent or m+n+2-valent phenyl group, $Ar^2$ comprises a phenylene group, and $Ar^3$ comprises a p+1-valent phenyl group.

[4]

The resin composition for the printed wiring board according to the above [1] or [2], wherein $Ar^1$ comprises an m+n+1-valent or m+n+2-valent phenyl group, $Ar^2$ comprises a biphenylene group, and $Ar^3$ comprises a p+1-valent phenyl group.

[5]

The resin composition for the printed wiring board according to any one of the above [1] to [4], wherein a content of the cyanate compound (A) is 1 to 90 parts by mass based on 100 parts by mass of resin solids in the resin composition for a printed wiring board.

[6]

The resin composition for the printed wiring board according to any one of the above [1] to [5], further comprising a filler (C).

[7]

The resin composition for a printed wiring board according to any one of the above [1] to [6], further comprising one or more compounds selected from the group consisting of a cyanate compound (D) other than the cyanate compound (A), a maleimide compound (E), and a phenolic resin (F).

[8]

The resin composition for the printed wiring board according to any one of the above [1] to [7], wherein the epoxy resin (B) comprises one or more epoxy resins selected from the group consisting of a biphenyl aralkyl-based epoxy resin, a naphthylene ether-based epoxy resin, a polyfunctional phenol-based epoxy resin, and a naphthalene-based epoxy resin.

[9]

The resin composition for the printed wiring board according to any one of the above [6] to [8], wherein a content of the filler (C) is 50 to 1600 parts by mass based on 100 parts by mass of the resin solids in the resin composition for a printed wiring board.

[10]

A prepreg comprising:

a base material; and the resin composition for the printed wiring board according to any one of the above [1] to [9] with which the base material is impregnated or coated.

[11]

A metal foil-clad laminate comprising:

a laminate of at least one or more of the prepregs according to the above [10] stacked; and metal foil disposed on one surface or both surfaces of the laminate.

[12]

A resin composite sheet comprising:

a support; and the resin composition according to any one of the above [1] to [9] applied and dried on a surface of the support.

[13]

A printed wiring board comprising:

an insulating layer comprising the resin composition according to any one of the above [1] to [9]; and a conductor layer formed on a surface of the insulating layer.

Advantageous Effect of Invention

According to the present invention, a resin composition that can realize a printed wiring board having excellent low water absorbency, heat resistance after moisture absorption, and flame retardancy, and a prepreg, a metal foil-clad laminate, a resin composite sheet, and a printed wiring board using the same can be provided.

DESCRIPTION OF EMBODIMENT

A mode for carrying out the present invention (hereinafter referred to as "this embodiment") will be described in detail below, but the present invention is not limited to this, and various modifications can be made without departing from the spirit thereof.

[Resin Composition for Printed Wiring Board]

A resin composition for a printed wiring board in this embodiment (hereinafter also referred to as a "resin composition") comprises a cyanate compound (A) represented by the following general formula (1); and an epoxy resin (B).

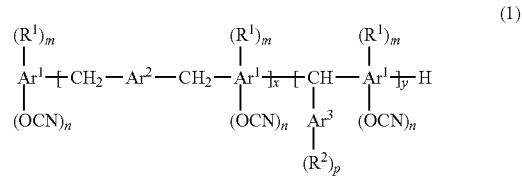

(1)

wherein $Ar^1$ represents an aryl group, $Ar^2$ each independently represents a divalent substituent selected from the group consisting of a phenylene group, a naphthylene group, and a biphenylene group, $Ar^3$ each independently represents a p+1-valent substituent selected from the group consisting of a p+1-valent phenyl group, a p+1-valent naphthyl group, and a p+1-valent biphenyl group, $R^1$ each independently represents a monovalent substituent selected from the group consisting of a hydrogen atom, an alkyl group, and an aryl group, $R^2$ each independently represents a monovalent substituent selected from the group consisting of a hydrogen atom, an alkyl group, an aryl group, and a cyanato group, n represents the number of cyanato groups bonded to $Ar^1$ and is an integer of 1 to 3, m represents the number of $R^1$ bonded to $Ar^1$, n+m+2 is equal to or less than the number of possible bonds to $Ar^1$, p represents the number of $R^2$ bonded to $Ar^3$ and is an integer of 1 to 9, x and y represent the ratio of repeating units, x is 1, whereas y is 0.25 to 2.0, and the repeating units for x and y may each be continuously arranged or may be alternately or randomly arranged with each other.

A resin composition having the above configuration can result in a resin composition that can realize a printed wiring board having excellent low water absorbency, heat resistance after moisture absorption, and flame retardancy. In addition, according to a preferred aspect of this embodiment, a resin composition comprising only non-halogen-based compounds (in other words, a resin composition comprising no halogen-based compound or a non-halogen-based resin composition), a prepreg, a resin composite sheet, a metal foil-clad laminate, and the like can also be realized, and their industrial practicality is extremely high. The resin composition in this embodiment will be described below.

[Cyanate Compound (A)]

The cyanate compound (A) has the structure represented by the above general formula (1). A resin cured product obtained by curing a resin composition containing the cyanate compound (A) having such a structure has excellent low water absorbency, heat resistance after moisture absorption, and flame retardancy.

The aryl group represented by $Ar^1$ in general formula (1) is not particularly limited. Examples thereof include an m+n+1-valent or m+n+2-valent phenyl group, naphthyl group, biphenyl group, xylyl group, mesityl group, phenoxyphenyl group, ethylphenyl group, o-, m-, or p-fluorophenyl group, dichlorophenyl group, dicyanophenyl group, trifluorophenyl group, methoxyphenyl group, and o-, m-, or p-tolyl group. Among these, an m+n+1-valent or m+n+2-valent phenyl group and an m+n+1-valent or m+n+2-valent biphenyl group are preferred, and a divalent or trivalent phenyl group and a divalent or trivalent biphenyl group are more preferred.

In general formula (1), $Ar^2$ each independently represents a divalent substituent selected from the group consisting of a phenylene group, a naphthylene group, and a biphenylene group. Among these, a phenylene group and a biphenylene group are preferred.

In general formula (1), $Ar^3$ each independently represents a p+1-valent substituent selected from the group consisting of a p+1-valent phenyl group, a p+1-valent naphthyl group, and a p+1-valent biphenyl group. Among these, a p+1-valent phenyl group and a p+1-valent biphenyl group are preferred, and a phenyl group is more preferred.

Among these, it is preferred that $Ar^1$ comprises an m+n+1-valent or m+n+2-valent phenyl group or an m+n+1-valent or m+n+2-valent biphenyl group, $Ar^2$ comprises a phenylene group or a biphenylene group, and $Ar^3$ comprises a p+1-valent phenyl group or a p+1-valent biphenyl group, and it is more preferred that $Ar^1$ comprises a divalent or trivalent phenyl group or a divalent or trivalent biphenyl group, $Ar^2$ comprises a phenylene group or a biphenylene group, and $Ar^3$ comprises a phenyl group or a biphenyl group. By having such $Ar^1$, $Ar^2$, and $Ar^3$, the low water absorbency, heat resistance after moisture absorption, and flame retardancy tend to improve more.

In addition, it is preferred that $Ar^1$ comprises an m+n+1-valent or m+n+2-valent phenyl group, $Ar^2$ comprises a phenylene group, and $Ar^3$ comprises a p+1-valent phenyl group, and it is more preferred that $Ar^1$ comprises a divalent or trivalent phenyl group, $Ar^2$ comprises a phenylene group, and $Ar^3$ comprises a phenyl group. By having such $Ar^1$, $Ar^2$, and $Ar^3$, the low water absorbency, heat resistance after moisture absorption, and flame retardancy tend to improve more.

Further, it is preferred that $Ar^1$ comprises an m+n+1-valent or m+n+2-valent phenyl group, $Ar^2$ comprises a biphenylene group, and $Ar^3$ comprises a p+1-valent phenyl group, and it is preferred that $Ar^1$ comprises a divalent or trivalent phenyl group, $Ar^2$ comprises a biphenylene group, and $Ar^3$ comprises a phenyl group. By having such $Ar^1$, $Ar^2$, and $Ar^3$, the low water absorbency, heat resistance after moisture absorption, and flame retardancy tend to improve more.

The alkyl group represented by $R^1$ in general formula (1) is not particularly limited. Examples thereof include a methyl group, an ethyl group, a n-propyl group, an isopropyl group, a n-butyl group, an isobutyl group, a sec-butyl group, a t-butyl group, a n-pentyl group, a neopentyl group, a n-hexyl group, a hexyl group, a n-heptyl group, a n-octyl group, a n-ethylhexyl group, a n-nonyl group, and a n-decyl group. The alkyl group may have any of a chain structure, a cyclic structure (cycloalkyl group or the like), and a branched structure.

The aryl group represented by $R^1$ in general formula (1) is not particularly limited. Examples thereof include a phenyl group, a naphthyl group, and a biphenyl group.

The alkyl group represented by $R^2$ in general formula (1) is not particularly limited. Examples thereof include a methyl group, an ethyl group, a n-propyl group, an isopropyl group, a n-butyl group, an isobutyl group, a sec-butyl group, a t-butyl group, a n-pentyl group, a neopentyl group, a n-hexyl group, a texyl group, a n-heptyl group, a n-octyl group, a n-ethylhexyl group, a n-nonyl group, and a n-decyl group. The alkyl group may have any of a chain structure, a cyclic structure (cycloalkyl group or the like), and a branched structure.

The aryl group represented by $R^2$ in general formula (1) is not particularly limited. Examples thereof include a phenyl group, a naphthyl group, and a biphenyl group.

In general formula (1), a hydrogen atom of the alkyl group or the aryl group represented by $R^1$ or $R^2$ may be replaced by a substituent. The substituent is not particularly limited. Examples thereof include an alkyl group, an alkoxy group, a carbonyl group, an amino group, an imino group, a cyano group, an azo group, an azi group, a thiol group, a sulfo group, a nitro group, a hydroxy group, an acyl group, an aldehyde group, a cycloalkyl group, and an aryl group.

In general formula (1), n is each independently an integer of 1 to 3, preferably an integer of 1 to 2, and more preferably an integer of 1.

In general formula (1), m is each independently preferably an integer of 1 to 3, more preferably an integer of 1 to 2, and further preferably an integer of 1. n+m+2 is equal to or less than the number of possible bonds to $Ar^1$.

In general formula (1), p is an integer of 1 to 9, preferably an integer of 1 to 7, and more preferably an integer of 1 to 5.

In general formula (1), x and y represent the ratio of repeating units, x is 1, whereas y is 0.25 to 2.0, preferably 0.50 to 1.75, more preferably 0.75 to 1.5, and further preferably 0.9 to 1.5.

The number of repeating units represented by x in one molecule of the compound represented by general formula (1) is preferably 1 to 40, more preferably 1 to 30, and further preferably 1 to 20.

In addition, the number of repeating units represented by y in one molecule of the compound represented by general formula (1) is preferably 1 to 20, more preferably 1 to 15, and further preferably 1 to 10.

The repeating units represented by the numbers of repeating units, x and y, may each be continuously arranged or may be alternately or randomly arranged with each other. In other words, the cyanate compound (A) may be a block copolymer or a random copolymer. In addition, one cyanate compound (A) may be used alone, or two or more cyanate compounds (A) may be used in combination.

The content of the cyanate compound (A) is preferably 1 to 90 parts by mass, more preferably 10 to 90 parts by mass, and further preferably 20 to 70 parts by mass based on 100 parts by mass of resin solids in the resin composition. When the content of the cyanate compound (A) is in the above range, the low water absorbency and the heat resistance after moisture absorption tend to improve more. The content of the cyanate compound (A) can be appropriately set according to the desired characteristics and is not limited to the above.

Here, the "resin solids in the resin composition" refers to resin components in the resin composition excluding a solvent and a filler (C) unless otherwise noted, and 100 parts by mass of the resin solids refers to the total of components in the resin composition excluding a solvent and an inorganic filler being 100 parts by mass.

The number average molecular weight Mn of the cyanate compound (A) is preferably 200 to 5000, more preferably 300 to 3000, and further preferably 300 to 2000. When the number average molecular weight Mn is in the above range, the flame retardancy tends to improve more.

(Method for Producing Cyanate Compound (A))

The method for producing the cyanate compound (A) is not particularly limited. Examples thereof include a method of cyanation of the hydroxyl groups of a resin represented by the following general formula (2):

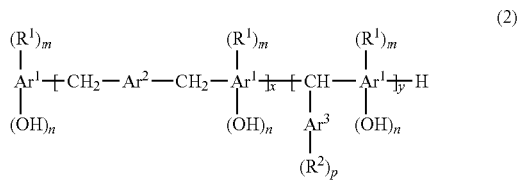

(2)

wherein $Ar^1$ represents an aryl group, $Ar^2$ each independently represents a divalent substituent selected from the group consisting of a phenylene group, a naphthylene group, and a biphenylene group, $Ar^3$ each independently represents a p+1-valent substituent selected from the group consisting of a p+1-valent phenyl group, a p+1-valent naphthyl group, and a p+1-valent biphenyl group, $R^1$ each independently represents a monovalent substituent selected from the group consisting of a hydrogen atom, an alkyl group, and an aryl group, $R^2$ each independently represents a monovalent substituent selected from the group consisting of a hydrogen atom, an alkyl group, an aryl group, and a cyanato group, n represents the number of OH groups bonded to $Ar^1$ and is an integer of 1 to 3, m represents the number of $R^1$ bonded to $Ar^1$, p represents the number of $R^2$ bonded to $Ar^3$ and is an integer of 1 to 5, x and y represent the ratio of repeating units, x is 1, whereas y is 0.25 to 2.0, and the repeating units for x and y may each be continuously arranged or may be alternately or randomly arranged with each other.

Specific forms of $Ar^1$, $Ar^2$, $Ar^3$, $R^1$, $R^2$, m, n, p, x, and y can be similar to those illustrated in general formula (1).

The method of cyanation of the hydroxyl groups of the resin represented by the above general formula (2) is not particularly limited, and known methods can be applied. Specific examples include a method of reacting the resin represented by general formula (2) and a cyanogen halide in a solvent in the presence of a basic compound; a method of reacting a phenolic resin and a cyanogen halide in a solvent in the presence of a base so that the cyanogen halide is always present in excess of the base (U.S. Pat. No. 3,553,244); a method of adding a tertiary amine and then dropping a cyanogen halide, or dropping both a cyanogen halide and a tertiary amine, into a bisphenol compound in the presence of a solvent while using the tertiary amine as a base and using the tertiary amine in excess of the cyanogen halide (Japanese Patent No. 3319061); a method of reacting a phenolic resin, a trialkylamine, and a cyanogen halide in a continuous plug flow mode (Japanese Patent No. 3905559); a method of treating with a cation and anion exchange pair a tert-ammonium halide produced as a by-product in reacting a phenolic resin and a cyanogen halide in a nonaqueous solution in the presence of a tert-amine (Japanese Patent No. 4055210); a method of simultaneously adding a tertiary amine and a cyanogen halide in the presence of a solvent separable from water to react a phenolic resin followed by water washing and separation, and precipitation and purification from the obtained solution using a poor solvent of a secondary or tertiary alcohol or a hydrocarbon (Japanese Patent No. 2991054); and further a method of reacting a naphthol, a cyanogen halide, and a tertiary amine in a two-phase solvent of water and an organic solvent under acidic conditions (Japanese Patent No. 5026727). In this embodiment, the cyanate compound (A) can be obtained preferably using these methods.

[Epoxy Resin (B)]

The epoxy resin (B) is not particularly limited. Examples thereof include known epoxy resins having two or more epoxy groups in one molecule. Specific examples include bisphenol A-based epoxy resins, bisphenol E-based epoxy resins, bisphenol F-based epoxy resins, bisphenol S-based epoxy resins, phenol novolac-based epoxy resins, bisphenol A novolac-based epoxy resins, glycidyl ester-based epoxy resins, aralkyl novolac-based epoxy resins, biphenyl aralkyl-based epoxy resins, naphthylene ether-based epoxy resins, cresol novolac-based epoxy resins, polyfunctional phenol-based epoxy resins, naphthalene-based epoxy resins, anthracene-based epoxy resins, naphthalene skeleton-modified novolac-based epoxy resins, phenol aralkyl-based epoxy resins, naphthol aralkyl-based epoxy resins, dicyclopentadiene-based epoxy resins, biphenyl-based epoxy resins, alicyclic epoxy resins, polyol-based epoxy resins, phosphorus-containing epoxy resins, glycidyl amines, glycidyl esters, compounds obtained by epoxidizing double bonds of butadiene and the like, and compounds obtained by reaction of hydroxyl group-containing silicone resins and epichlorohydrin. Among these, one or more epoxy resins selected from the group consisting of biphenyl aralkyl-based epoxy resins, naphthylene ether-based epoxy resins, polyfunctional phenol-based epoxy resins, and naphthalene-based epoxy resins are preferred. By using such an epoxy resin (B), the flame retardancy and the heat resistance tend to improve more. One epoxy resin (B) may be used alone, or two or more epoxy resins (B) may be used in combination.

The content of the epoxy resin (B) is preferably 10 to 99 parts by mass, more preferably 20 to 80 parts by mass, and further preferably 30 to 70 parts by mass, based on 100 parts by mass of the resin solids in the resin composition. When the content of the epoxy resin (B) is in the above range, the moldability tends to improve more. The content of the epoxy resin (B) can be appropriately set according to the desired characteristics and is not limited to the above.

[Filler (C)]

The resin composition in this embodiment may further contain the filler (C). As the filler (C), known inorganic fillers and organic fillers can be appropriately used, and the type of the filler (C) is not particularly limited. Among them, those generally used in laminate applications can be preferably used.

The inorganic fillers are not particularly limited. Examples thereof include silicas such as natural silica, fused silica, synthetic silica, amorphous silica, AEROSIL, and hollow silica; silicon compounds such as white carbon; metal oxides such as titanium white, zinc oxide, magnesium oxide, and zirconium oxide; metal nitrides such as boron nitride, aggregated boron nitride, silicon nitride, and aluminum nitride; metal sulfates such as barium sulfate; metal hydrates such as aluminum hydroxide, heat-treated products of aluminum hydroxide (products obtained by heat-treating aluminum hydroxide to decrease some of the water of crystallization), boehmite, and magnesium hydroxide; molybdenum compounds such as molybdenum oxide and zinc molybdate; zinc compounds such as zinc borate and zinc stannate; alumina, clay, kaolin, talc, calcined clay, calcined kaolin, calcined talc, mica, E-glass, A-glass, NE-glass, C-glass, L-glass, D-glass, S-glass, M-glass G20, glass short fibers (including fine powders of glass such as E glass, T glass, D glass, S glass, and Q glass), hollow glass, and spherical glass.

In addition, the organic fillers are not particularly limited. Examples thereof include rubber powders such as styrene-based powders, butadiene-based powders, and acrylic powders; core-shell-based rubber powders; silicone resin powders; silicone rubber powders; and silicone composite powders.

One of these fillers (C) may be used alone, or two or more of these fillers (C) may be used in combination.

The content of the filler (C) is preferably 50 to 1600 parts by mass, more preferably 50 to 300 parts by mass, and further preferably 30 to 200 parts by mass, based on 100 parts by mass of the resin solids in the resin composition. When the content of the filler (C) is in the above range, the moldability of the resin composition tends to improve more. The content of the filler (C) can be appropriately set according to the desired characteristics and is not limited to the above.

[Other Components]

When the filler (C) is used, a silane coupling agent and a wetting and dispersing agent are preferably used in combination.

(Silane Coupling Agent)

As the silane coupling agent, those generally used for surface treatment of inorganic matter can be preferably used, and the type of the silane coupling agent is not particularly limited. Specific examples include aminosilane-based compounds such as γ-aminopropyltriethoxysilane and N-β-(aminoethyl)-γ-aminopropyltrimethoxysilane; epoxysilane-based compounds such as γ-glycidoxypropyltrimethoxysilane and β-(3,4-epoxycyclohexyl)ethyltrimethoxysilane; vinylsilane-based compounds such as γ-methacryloxypropyltrimethoxysilane and vinyl-tri(β-methoxyethoxy)silane; cationic silane-based compounds such as N-β-(N-vinylbenzylaminoethyl)-γ-aminopropyltrimethoxysilane hydrochloride; and phenylsilane-based compounds. One silane coupling agent may be used alone, or two or more silane coupling agents may be used in combination.

(Wetting and Dispersing Agent)

In addition, as the wetting and dispersing agent, those generally used for paints can be preferably used, and the type of the wetting and dispersing agent is not particularly limited. Preferably, copolymer-based wetting and dispersing agents are used. Specific examples thereof include Disper-byk-110, 111, 161, and 180, BYK-W996, BYK-W9010, BYK-W903, and BYK-W940 manufactured by BYK Japan KK. One wetting and dispersing agent may be used alone, or two or more wetting and dispersing agents may be used in combination.

(Curing Accelerator)

In addition, the resin composition in this embodiment may contain a curing accelerator for appropriately adjusting the curing rate, as needed. As this curing accelerator, those generally used as curing accelerators for cyanate compounds, epoxy resins, and the like can be preferably used, and the type of the curing accelerator is not particularly limited. Specific examples thereof include organometallic salts such as zinc octylate, zinc naphthenate, cobalt naphthenate, copper naphthenate, acetylacetone iron, nickel octylate, and manganese octylate; phenol compounds such as phenol, xylenol, cresol, resorcin, catechol, octyl phenol, and nonyl phenol; alcohols such as 1-butanol and 2-ethylhexanol; imidazoles such as 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole, and 2-phenyl-4-methyl-5-hydroxymethylimidazole; derivatives such as adducts of carboxylic acids of the imidazoles or acid anhydrides thereof; amines such as dicyandiamide, benzyldimethylamine, and 4-methyl-N,N-dimethylbenzylamine; phosphorus compounds such as phosphine-based compounds, phosphine oxide-based compounds, phosphonium salt-based compounds, and diphosphine-based compounds; epoxy-imidazole adduct-based compounds; peroxides such as benzoyl peroxide, p-chlorobenzoyl peroxide, di-t-butyl peroxide, diisopropyl peroxycarbonate, and di-2-ethylhexyl peroxycarbonate; or azo compounds such as azobisisobutyronitrile. One curing accelerator may be used alone, or two or more curing accelerators may be used in combination.

The content of the curing accelerator is preferably 0.005 to 10 parts by mass based on 100 parts by mass of the resin solids in the resin composition. The content of the curing accelerator can be appropriately adjusted considering the degrees of cure of the resins, the viscosity of the resin composition, and the like and is not limited to the above.

The resin composition in this embodiment may contain a cyanate compound (D) other than the cyanate compound (A), a maleimide compound (E), a phenolic resin (F), an oxetane resin (G), a benzoxazine compound (H), and/or a compound (I) having a polymerizable unsaturated group, and the like, as needed. Among these, the resin composition in this embodiment preferably further contains one or more compounds selected from the group consisting of the cyanate compound (D), the maleimide compound (E), and the phenolic resin (F).

(Cyanate Compound (D))

The cyanate compound (D) is not particularly limited. Examples thereof include compounds having in the molecule an aromatic moiety substituted by at least one cyanato group. Such compounds are not particularly limited. Examples thereof include a compound represented by the following general formula (3):

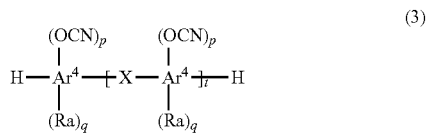

wherein Ar⁴ each independently represents a p+q+1-valent or p+q+2-valent substituent selected from the group consisting of a phenyl group, a naphthyl group, or a biphenyl group, Ra each independently represents a substituent selected from the group consisting of a hydrogen atom, an alkyl group having 1 to 6 carbon atoms, an aryl group having 6 to 12 carbon atoms, an alkoxy group having 1 to 4 carbon atoms, an aralkyl group, and an alkylaryl group, and p represents the number of cyanato groups bonded to Ar⁴ and is an integer of 1 to 3; and q represents the number of Ra bonded to Ar⁴, t represents an integer of 0 to 50, and X represents a substituent selected from the group consisting of a single bond, a divalent organic group having 1 to 20 carbon atoms (a hydrogen atom may be replaced by a heteroatom), a divalent organic group having 1 to 10 nitrogen atoms (—N—R—N— or the like), and divalent substituents represented by the following formulas:

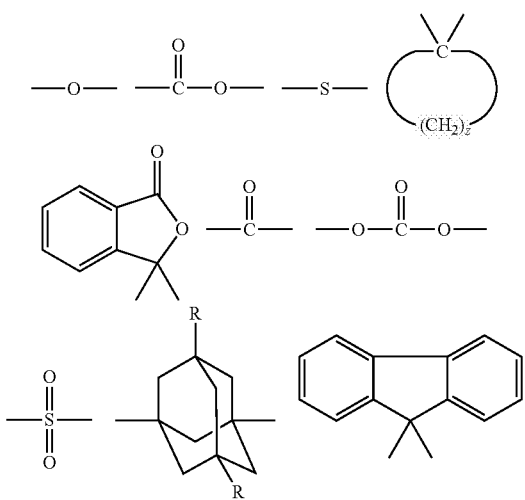

wherein z represents an integer of 4 to 7; and R each independently represents a hydrogen atom or an alkyl group having 1 to 6 carbon atoms.

The alkyl group represented by Ra in general formula (3) is not particularly limited. Examples thereof include a methyl group, an ethyl group, a propyl group, an isopropyl group, a n-butyl group, an isobutyl group, a tert-butyl group, a n-pentyl group, a 1-ethylpropyl group, a 2,2-dimethylpropyl group, a cyclopentyl group, a hexyl group, a cyclohexyl group, and a trifluoromethyl group. The alkyl group may have any of a chain structure, a cyclic structure (cycloalkyl group or the like), and a branched structure.

The aryl group represented by Ra in general formula (3) is not particularly limited. Examples thereof include a phenyl group, a xylyl group, a mesityl group, a naphthyl group, a phenoxyphenyl group, an ethylphenyl group, an o-, m-, or p-fluorophenyl group, a dichlorophenyl group, a dicyanophenyl group, a trifluorophenyl group, a methoxyphenyl group, a biphenyl group, and an o-, m-, or p-tolyl group. Further, examples of the alkoxy group include a methoxy group, an ethoxy group, a propoxy group, an isopropoxy group, a n-butoxy group, an isobutoxy group, and a tert-butoxy group.

In general formula (3), a hydrogen atom of the alkyl group or the aryl group represented by Ra may be replaced by a substituent. The substituent is not particularly limited. Examples thereof include halogen atoms such as fluorine and chlorine; alkoxy groups such as a methoxy group and a phenoxy group; and a cyano group.

The divalent organic group for X in general formula (3) is not particularly limited. Examples thereof include a methylene group, an ethylene group, a trimethylene group, a propylene group, a cyclopentylene group, a cyclohexylene group, a trimethylcyclohexylene group, a biphenylylmethylene group, a dimethylmethylene-phenylene-dimethylmethylene group, a fluorenediyl group, and a phthalidediyl group. A hydrogen atom in the divalent organic group may be replaced by a substituent. The substituent is not particularly limited. Examples thereof include halogen atoms such as fluorine and chlorine, alkoxy groups such as a methoxy group and a phenoxy group, and a cyano group.

The divalent organic group having 1 to 10 nitrogen atoms for X in general formula (3) is not particularly limited. Examples thereof include an imino group and a polyimide group.

In addition, examples of X in general formula (3) include one that is a structure represented by the following general formula (4) or the following formula:

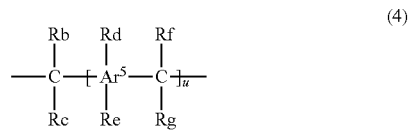

wherein Ar⁵ represents a substituent selected from the group consisting of a phenylene group, a naphthylene group, and a biphenylene group, Rb, Rc, Rf, and Rg each independently represent a substituent selected from the group consisting of a hydrogen atom, an alkyl group having 1 to 6 carbon atoms, an aryl group having 6 to 12 carbon atoms, a trifluoromethyl group, and an aryl group substituted by at least one phenolic hydroxyl group, Rd and Re each independently represent a substituent selected from the group consisting of a hydrogen atom, an alkyl group having 1 to 6 carbon atoms, an aryl group having 6 to 12 carbon atoms, an alkoxy group having 1 to 4 carbon atoms, and a hydroxyl group, and u represents an integer of 0 to 5.

Ar⁵ in general formula (4) is not particularly limited. Examples thereof include a 1,4-phenylene group, a 1,3-phenylene group, a 4,4'-biphenylene group, a 2,4'-biphenylene group, a 2,2'-biphenylene group, a 2,3'-biphenylene group, a 3,3'-biphenylene group, a 3,4'-biphenylene group, a 2,6-naphthylene group, a 1,5-naphthylene group, a 1,6-naphthylene group, a 1,8-naphthylene group, a 1,3-naphthylene group, and a 1,4-naphthylene group.

The alkyl group and the aryl group for Rb to Rf in general formula (4) are not particularly limited. Examples thereof include those similar to those described in general formula (3).

The cyanate compound (D) is not particularly limited. Examples thereof include cyanatobenzene, 1-cyanato-2-, 1-cyanato-3-, or 1-cyanato-4-methylbenzene, 1-cyanato-2-, 1-cyanato-3-, or 1-cyanato-4-methoxybenzene, 1-cyanato-2,3-, 1-cyanato-2,4-, 1-cyanato-2,5-, 1-cyanato-2,6-, 1-cyanato-3,4-, or 1-cyanato-3,5-dimethylbenzene, cyanatoethylbenzene, cyanatobutylbenzene, cyanatooctylbenzene, cyanatononylbenzene, 2-(4-cyanatophenyl)-2-phenylpropane (a cyanate of 4-α-cumylphenol), 1-cyanato-4-cyclohexylbenzene, 1-cyanato-4-vinylbenzene, 1-cyanato-2- or 1-cyanato-3-chlorobenzene, 1-cyanato-2,6-dichlorobenzene, 1-cyanato-2-methyl-3-chlorobenzene, cyanatonitrobenzene, 1-cyanato-4-nitro-2-ethylbenzene, 1-cyanato-2-methoxy-4-allylbenzene (a cyanate of eugenol), methyl(4-cyanatophenyl)sulfide, 1-cyanato-3-trifluoromethylbenzene, 4-cyanatobiphenyl, 1-cyanato-2- or 1-cyanato-4-acetylbenzene, 4-cyanatobenzaldehyde, methyl 4-cyanatobenzoate ester, phenyl 4-cyanatobenzoate ester, 1-cyanato-4-acetaminobenzene, 4-cyanatobenzophenone, 1-cyanato-2,6-di-tert-butylbenzene, 1,2-dicyanatobenzene, 1,3-dicyanatobenzene, 1,4-dicyanatobenzene, 1,4-dicyanato-2-tert-butylbenzene, 1,4-dicyanato-2,4-dimethylbenzene, 1,4-dicyanato-2,3,4-dimethylbenzene, 1,3-dicyanato-2,4,6-trimethylbenzene, 1,3-dicyanato-5-methylbenzene, 1-cyanato- or 2-cyanatonaphthalene, 1-cyanato4-methoxynaphthalene, 2-cyanato-6-methylnaphthalene, 2-cyanato-7-methoxynaphthalene, 2,2'-dicyanato-1,1'-binaphthyl, 1,3-, 1,4-, 1,5-, 1,6-, 1,7-, 2,3-, 2,6-, or 2,7-dicyanatonaphthalene, 2,2'- or 4,4'-dicyanatobiphenyl, 4,4'-dicyanatooctafluorobiphenyl, 2,4'- or 4,4'-dicyanatodiphenylmethane, bis(4-cyanato-3,5-dimethylphenyl)methane, 1,1-bis(4-cyanatophenyl)ethane, 1,1-bis(4-cyanatophenyl)propane, 2,2-bis(4-cyanatophenyl)propane, 2,2-bis(4-cyanato-3-methylphenyl)propane, 2,2-bis(2-cyanato-5-biphenylyl)propane, 2,2-bis(4-cyanatophenyl)hexafluoropropane, 2,2-bis(4-cyanato-3,5-dimethylphenyl)propane, 1,1-bis(4-cyanatophenyl)butane, 1,1-bis(4-cyanatophenyl)isobutane, 1,1-bis(4-cyanatophenyl)pentane, 1,1-bis(4-cyanatophenyl)-3-methylbutane, 1,1-bis(4-cyanatophenyl)-2-methylbutane, 1,1-bis(4-cyanatophenyl)-2,2-dimethylpropane, 2,2-bis(4-cyanatophenyl)butane, 2,2-bis(4-cyanatophenyl)pentane, 2,2-bis(4-cyanatophenyl)hexane, 2,2-bis(4-cyanatophenyl)-3-methylbutane, 2,2-bis(4-cyanatophenyl)-4-methylpentane, 2,2-bis(4-cyanatophenyl)-3,3-dimethylbutane, 3,3-bis(4-cyanatophenyl)hexane, 3,3-bis(4-cyanatophenyl)heptane, 3,3-bis(4-cyanatophenyl)octane, 3,3-bis(4-cyanatophenyl)-2-methylpentane, 3,3-bis(4-cyanatophenyl)-2-methylhexane, 3,3-bis(4-cyanatophenyl)-2,2-dimethylpentane, 4,4-bis(4-cyanatophenyl)-3-methylheptane, 3,3-bis(4-cyanatophenyl)-2-methylheptane, 3,3-bis(4-cyanatophenyl)-2,2-dimethylhexane, 3,3-bis(4-cyanatophenyl)-2,4-dimethylhexane, 3,3-bis(4-cyanatophenyl)-2,2,4-trimethylpentane, 2,2-bis(4-cyanatophenyl)-1,1,1,3,3,3-hexafluoropropane, bis(4-cyanatophenyl)phenylmethane, 1,1-bis(4-cyanatophenyl)-1-phenylethane, bis(4-cyanatophenyl) biphenylmethane, 1,1-bis(4-cyanatophenyl)cyclopentane, 1,1-bis(4-cyanatophenyl)cyclohexane, 2,2-bis(4-cyanato-3-isopropylphenyl)propane, 1,1-bis(3-cyclohexyl-4-cyanatophenyl)cyclohexane, bis(4-cyanatophenyl)diphenylmethane, bis(4-cyanatophenyl)-2,2-dichloroethylene; 1,3-bis[2-(4-cyanatophenyl)-2-propyl]benzene, 1,4-bis[2-(4-cyanatophenyl)-2-propyl]benzene, 1,1-bis(4-cyanatophenyl)-3,3,5-trimethylcyclohexane, 4-[bis(4-cyanatophenyl)methyl]biphenyl, 4,4-dicyanatobenzophenone, 1,3-bis(4-cyanatophenyl)-2-propen-1-one, bis(4-cyanatophenyl) ether, bis(4-cyanatophenyl) sulfide, bis(4-cyanatophenyl) sulfone, 4-cyanatobenzoic acid-4-cyanatophenyl ester (4-cyanatophenyl-4-cyanatobenzoate), bis-(4-cyanatophenyl) carbonate, 1,3-bis(4-cyanatophenyl)adamantane, 1,3-bis(4-cyanatophenyl)-5,7-dimethyladamantane, 3,3-bis(4-cyanatophenyl)isobenzofuran-1 (3H)-one (a cyanate of phenolphthalein), 3,3-bis(4-cyanato-3-methylphenyl)isobenzofuran-1(3H)-one (a cyanate of o-cresolphthalein), 9,9'-bis(4-cyanatophenyl)fluorene, 9,9-bis(4-cyanato-3-methylphenyl)fluorene, 9,9-bis(2-cyanato-5-biphenylyl)fluorene, tris(4-cyanatophenyl)methane, 1,1,1-tris(4-cyanatophenyl)ethane, 1,1,3-tris(4-cyanatophenyl) propane, α,α,α'-tris(4-cyanatophenyl)-1-ethyl-4-isopropylbenzene, 1,1,2,2-tetrakis(4-cyanatophenyl) ethane, tetrakis(4-cyanatophenyl)methane, 2,4,6-tris(N-methyl-4-cyanatoanilino)-1,3,5-triazine, 2,4-bis(N-methyl-4-cyanatoanilino)-6-(N-methylanilino)-1,3,5-triazine, bis(N-4-cyanato-2-methylphenyl)-4,4'-oxydiphthalimide, bis(N-3-cyanato-4-methylphenyl)-4,4'-oxydiphthalimide, bis(N-4-cyanatophenyl)-4,4'-oxydiphthalimide, bis(N-4-cyanato-2-methylphenyl)-4,4'-(hexafluoroisopropylidene) diphthalimide, tris(3,5-dimethyl-4-cyanatobenzyl) isocyanurate, 2-phenyl-3,3-bis(4-cyanatophenyl)phthalimidine, 2-(4-methylphenyl)-3,3-bis(4-cyanatophenyl)phthalimidine, 2-phenyl-3,3-bis(4-cyanato-3-methylphenyl) phthalimidine, 1-methyl-3,3-bis(4-cyanatophenyl)indolin-2-one, 2-phenyl-3,3-bis(4-cyanatophenyl)indolin-2-one, and products obtained by cyanation of phenolic resins such as phenol novolac resins, cresol novolac resins, phenol aralkyl resins, cresol aralkyl resins, naphthol aralkyl resins, biphenyl aralkyl resins, phenol-modified xylene formaldehyde resins, and phenol-modified dicyclopentadiene resins by methods similar to the above, and prepolymers thereof.

The phenol novolac resins and the cresol novolac resins are not particularly limited. Examples thereof include those obtained by reacting a phenol, an alkyl-substituted phenol, or a halogen-substituted phenol and a formaldehyde compound such as formalin or paraformaldehyde in an acidic solution by a known method.

The phenol aralkyl resins, the cresol aralkyl resins, the naphthol aralkyl resins, and the biphenyl aralkyl resins are not particularly limited. Examples thereof include those obtained by reacting a bishalogenomethyl compound as represented by $Ar^5$—$(CH_2Y)_2$ and a phenol compound with an acidic catalyst or without a catalyst by a known method, and those obtained by reacting a bis(alkoxymethyl) compound as represented by $Ar^5$—$(CH_2OR)_2$ or a bis(hydroxymethyl) compound as represented by $Ar^5$—$(CH_2OH)_2$ and a phenol compound in the presence of an acidic catalyst by a known method.

The phenol-modified xylene formaldehyde resins are not particularly limited. Examples thereof include those obtained by reacting a xylene formaldehyde resin and a phenol compound in the presence of an acidic catalyst by a known method.

One of these cyanate compounds (D) may be used alone, or two or more of these cyanate compounds (D) may be used in combination.

The content of the cyanate compound (D) is preferably 1 to 30 parts by mass, more preferably 2 to 20 parts by mass, and further preferably 3 to 10 parts by mass, based on 100 parts by mass of the resin solids in the resin composition. When the content of the cyanate compound (D) is in the above range, the low water absorbency and the flame retardancy tend to improve more.

(Maleimide Compound (E))

As the maleimide compound (E), those generally known can be used as long as they are compounds having one or more maleimide groups in one molecule. Examples of the maleimide compound (E) include 4,4-diphenylmethanebismaleimide, phenylmethanemaleimide, m-phenylenebismaleimide, 2,2-bis(4-(4-maleimidophenoxy)-phenyl)propane, 3,3-dimethyl-5,5-diethyl-4,4-diphenylmethanebismaleimide, 4-methyl-1,3-phenylenebismaleimide, 1,6-bismaleimido-(2,2,4-trimethyl)hexane, 4,4-diphenyl ether bismaleimide, 4,4-diphenyl sulfone bismaleimide, 1,3-bis(3-maleimidophenoxy)benzene, 1,3-bis(4-maleimidophenoxy) benzene, polyphenylmethanemaleimide, and prepolymers of these maleimide compounds or prepolymers of maleimide compounds and amine compounds but are not particularly limited. One of these maleimide compounds may be used alone, or two or more of these maleimide compounds may be used in combination.

The content of the maleimide compound (E) is preferably 1 to 70 parts by mass, more preferably 5 to 50 parts by mass, and further preferably 10 to 30 parts by mass, based on 100 parts by mass of the resin solids in the resin composition. When the content of the maleimide compound (E) is in the above range, the heat resistance tends to improve more.

(Phenolic Resin (F))

As the phenolic resin (F), those generally known can be used as long as they are phenolic resins having two or more hydroxyl groups in one molecule. Examples of the phenolic resin (F) include bisphenol A-based phenolic resins, bisphenol E-based phenolic resins, bisphenol F-based phenolic resins, bisphenol S-based phenolic resins, phenol novolac resins, bisphenol A novolac-based phenolic resins, glycidyl ester-based phenolic resins, aralkyl novolac-based phenolic resins, biphenyl aralkyl-based phenolic resins, cresol novolac-based phenolic resins, polyfunctional phenolic resins, naphthol resins, naphthol novolac resins, polyfunctional naphthol resins, anthracene-based phenolic resins, naphthalene skeleton-modified novolac-based phenolic resins, phenol aralkyl-based phenolic resins, naphthol aralkyl-based phenolic resins, dicyclopentadiene-based phenolic resins, biphenyl-based phenolic resins, alicyclic phenolic resins, polyol-based phenolic resins, phosphorus-containing phenolic resins, and hydroxyl group-containing silicone resins but are not particularly limited. One of these phenolic resins may be used alone, or two or more of these phenolic resins may be used in combination.

(Oxetane Resin (G))

As the oxetane resin (G), those generally known can be used. Examples of the oxetane resin (G) include oxetane, alkyloxetanes such as 2-methyloxetane, 2,2-dimethyloxetane, 3-methyloxetane, and 3,3-dimethyloxetane, 3-methyl-3-methoxymethyloxetane, 3,3-di(trifluoromethyl)perfluoxetane, 2-chloromethyloxetane, 3,3-bis(chloromethyl) oxetane, biphenyl-based oxetane, OXT-101 (trade name manufactured by Toagosei Co., Ltd.), and OXT-121 (trade name manufactured by Toagosei Co., Ltd.) and are not particularly limited. One of these oxetane resins may be used alone, or two or more of these oxetane resins may be used in combination.

(Benzoxazine Compound (H))

As the benzoxazine compound (H), those generally known can be used as long as they are compounds having two or more dihydrobenzoxazine rings in one molecule. Examples of the benzoxazine compound (H) include bisphenol A-based benzoxazine BA-BXZ (trade name manufactured by Konishi Chemical Ind. Co., Ltd.), bisphenol F-based benzoxazine BF-BXZ (trade name manufactured by Konishi Chemical Ind. Co., Ltd.), and bisphenol S-based benzoxazine BS-BXZ (trade name manufactured by Konishi Chemical Ind. Co., Ltd.) and are not particularly limited. One of these benzoxazine compounds may be used alone, or two or more of these benzoxazine compounds may be used in combination.

(Compound (I) Having Polymerizable Unsaturated Group)

As the compound (I) having a polymerizable unsaturated group, those generally known can be used. Examples of the compound (I) having a polymerizable unsaturated group include vinyl compounds such as ethylene, propylene, styrene, divinylbenzene, and divinylbiphenyl, (meth)acrylates of monohydric or polyhydric alcohols such as methyl (meth) acrylate, 2-hydroxyethyl (meth)acrylate, 2-hydroxypropyl (meth)acrylate, polypropylene glycol di(meth)acrylate, trimethylolpropane di(meth)acrylate, trimethylolpropane tri (meth)acrylate, pentaerythritol tetra(meth)acrylate, and dipentaerythritol hexa(meth)acrylate, epoxy (meth)acrylates such as bisphenol A-based epoxy (meth)acrylate and bisphenol F-based epoxy (meth)acrylate, benzocyclobutene resins, and (bis)maleimide resins and are not particularly limited. One of these compounds having an unsaturated group may be used alone, or two or more of these compounds having an unsaturated group may be used in combination.

Further, various polymer compounds such as another thermosetting resin, a thermoplastic resin and an oligomer thereof, and an elastomer, a flame-retardant compound, various additives, and the like can be used in combination in the resin composition in this embodiment as needed. These are not particularly limited as long as they are those generally used. Examples of the flame-retardant compound include bromine compounds such as 4,4'-dibromobiphenyl, phosphates, melamine phosphate, phosphorus-containing epoxy resins, nitrogen compounds such as melamine and benzoguanamine, oxazine ring-containing compounds, and silicone-based compounds. In addition, examples of the various additives include ultraviolet absorbing agents, antioxidants, photopolymerization initiators, fluorescent brightening agents, photosensitizers, dyes, pigments, thickening agents, flow-adjusting agents, lubricants, defoaming agents, dispersing agents, leveling agents, brightening agents, and polymerization inhibitors. One of these may be used alone or two or more of these may be used in combination as desired.

An organic solvent can be used in the resin composition in this embodiment as needed. In this case, the resin composition of the present invention can be used as a form (solution or varnish) in which at least some, preferably all, of the above-described various resin components are dissolved in or compatible with the organic solvent. As the organic solvent, known ones can be appropriately used as long as they can dissolve or be compatible with at least some, preferably all, of the above-described various resin components. The type of the organic solvent is not particularly limited. Specific examples include polar solvents such as ketones such as acetone, methyl ethyl ketone, and methyl isobutyl ketone, cellosolve-based solvents such as propylene glycol monomethyl ether and propylene glycol monomethyl ether acetate, ester-based solvents such as ethyl lactate, methyl acetate, ethyl acetate, butyl acetate, isoamyl acetate, ethyl lactate, methyl methoxypropionate, and methyl hydroxyisobutyrate, and amides such as dimethylacetamide and dimethylformamide, and nonpolar solvents such as aromatic hydrocarbons such as toluene and xylene. One of these may be used alone, or two or more of these may be used in combination.

[Applications]

The resin composition in this embodiment can be used as an insulating layer of a printed wiring board and a semiconductor package material. Applications will be described below.

[Prepreg]

A prepreg in this embodiment comprises a base material; and the above resin composition with which the base material is impregnated or coated. The prepreg can be obtained, for example, by impregnating or coating a base material with a solution of the resin composition of the present invention dissolved in a solvent and drying the solution.

In addition, a buildup film or a dry film solder resist can be provided by using a peelable plastic film as a base material, coating the plastic film with a solution of the resin composition of the present invention dissolved in a solvent, and drying the solution. Here, the solvent can be dried by heating at a temperature of 20° C. to 150° C. for 1 to 90 minutes. In addition, the resin composition can also be used in an uncured state in which the solvent is only dried, or in a semi-cured (B-staged) state as needed.

The prepreg in this embodiment will be described in detail below. The method for producing the prepreg is not particularly limited as long as it is a method of combining the resin composition in this embodiment and a base material to produce a prepreg. Specifically, the prepreg in this embodiment can be produced by impregnating or coating a base material with the resin composition in this embodiment and then semi-curing the resin composition by a method of drying at 120 to 220° C. for about 2 to 15 minutes, or the like. At this time, the amount of the resin composition adhered to the base material, that is, the amount of the resin composition (including the filler (C)) based on the total amount of the prepreg after the semi-curing, is preferably 20 to 99% by mass.

As the base material, known ones used for various printed wiring board materials can be used. Examples of the base material include, but are not particularly limited to, woven fabrics of fibers of glass such as E glass, D glass, L glass, S glass, T glass, Q glass, UN glass, NE glass, and spherical glass; inorganic fibers of materials other than glass, such as quartz; organic fibers of polyimides, polyamides, polyesters, and the like; liquid crystal polyesters; and the like.

As the shape of the base material, woven fabrics, nonwoven fabrics, rovings, chopped strand mats, surfacing mats, and the like are known, and the shape of the base material may be any. One base material may be used alone, or two or more base materials may be used in combination.

In addition, the thickness of the base material is not particularly limited, but is preferably 0.01 to 0.2 mm in laminate applications. Particularly, woven fabrics subjected to ultra-opening treatment or clogging treatment are preferred from the viewpoint of dimensional stability. Further, glass woven fabrics surface-treated with silane coupling agents for epoxysilane treatment, aminosilane treatment, and the like are preferred from the viewpoint of heat resistance after moisture absorption. In addition, liquid crystal polyester woven fabrics are preferred in terms of electrical characteristics.

[Metal Foil-Clad Laminate]

A metal foil-clad laminate in this embodiment comprises a laminate of at least one or more of the above prepregs stacked; and metal foil disposed on one surface or both surfaces of the laminate. Specifically, the metal foil-clad laminate in this embodiment can be fabricated by stacking one or a plurality of the above-described prepregs, disposing foil of a metal such as copper or aluminum on one surface or both surfaces of the stack, and laminate-molding the metal foil and the stack.

The metal foil used here is not particularly limited as long as it is one used for a printed wiring board material. Copper foil such as rolled copper foil and electrolytic copper foil is preferred. In addition, the thickness of the metal foil is not particularly limited but is preferably 2 to 70 μm, more preferably 3 to 35 μm.

As the molding conditions, usual methods for laminates and multilayer boards for printed wiring boards can be applied. For example, the metal foil-clad laminate of the present invention can be produced by laminate-molding with a temperature of 180 to 350° C., a heating time of 100 to 300 minutes, and a surface pressure of 20 to 100 kg/cm$^2$ using a multistage press, a multistage vacuum press, a continuous molding machine, an autoclave molding machine, or the like. In addition, a multilayer board can also be provided by laminate-molding the above prepreg and a separately fabricated wiring board for an inner layer in combination.

As the method for producing a multilayer board, for example, a multilayer board can be fabricated by disposing 35 μm copper foil on both surfaces of one of the above-described prepreg, laminating and forming the copper foil and the prepreg under the above conditions, then forming inner layer circuits, subjecting these circuits to blackening treatment to form an inner layer circuit board, then alternately disposing these inner layer circuit boards and the above prepregs one by one, further disposing copper foil on the outermost layers, and laminate-molding the copper foil, the inner layer circuit boards, and the prepregs under the above conditions preferably under vacuum.

[Printed Wiring Board]

A printed wiring board in this embodiment comprises an insulating layer comprising the above resin composition; and a conductor layer formed on a surface of the insulating layer. The above-described metal foil-clad laminate can be preferably used as a printed wiring board. The printed wiring board can be produced according to an ordinary method, and the method for producing the printed wiring board is not particularly limited.

One example of a method for producing a printed wiring board will be shown below. First, a metal foil-clad laminate such as the above-described copper-clad laminate is provided. Next, the surfaces of the metal foil-clad laminate are subjected to etching treatment to form inner layer circuits to fabricate an inner layer board. The inner layer circuit surfaces of this inner layer board are subjected to surface treatment for increasing adhesive strength, as needed. Then, the required number of the above-described prepregs are stacked on the inner layer circuit surfaces, metal foil for outer layer circuits is further laminated on the outside of the stack, and heat and pressure are applied for integral molding. In this manner, a multilayer laminate in which insulating layers comprising a base material and a cured product of a thermosetting resin composition are formed between inner layer circuits and metal foil for outer layer circuits is produced. Then, this multilayer laminate is subjected to perforation for through holes and via holes, and then plating metal films that allow conduction between the inner layer circuits and the metal foil for outer layer circuits are formed on the wall surfaces of these holes. Further, the metal foil for outer layer circuits is subjected to etching treatment to form outer layer circuits. Thus, a printed wiring board is produced.

The printed wiring board obtained in the above production example has a configuration in which it has insulating layers and conductor layers formed on surfaces of these insulating layers, and the insulating layers comprise the resin composition in this embodiment described above. In other words, the prepreg in this embodiment described above (the base material and the resin composition in this embodiment with which the base material is impregnated or coated) and the resin composition layer of the metal foil-clad laminate in this embodiment described above (the layer comprising the resin composition of the present invention) are composed of an insulating layer comprising the resin composition in this embodiment.

[Resin Composite Sheet]

A resin composite sheet in this embodiment comprises a support; and the resin composition according to any one of claims 1 to 9 applied and dried on a surface of the support. The resin composite sheet can be obtained by coating a support with a solution of the above resin composition in this embodiment dissolved in a solvent and drying the solution.

Examples of the support used here include organic film base materials such as polyethylene films, polypropylene films, polycarbonate films, polyethylene terephthalate films, ethylene-tetrafluoroethylene copolymer films, and release films obtained by coating surfaces of these films with release agents, and polyimide films, conductor foil such as copper foil and aluminum foil, and plate-shaped supports such as glass plates, SUS plates, and FRP but are not particularly limited.

Examples of the coating method include a method of coating a support with a solution of the resin composition in this embodiment dissolved in a solvent by a bar coater, a die coater, a doctor blade, a baker applicator, or the like. In addition, a single-layer sheet (resin sheet) can also be provided by peeling or etching the support from the laminated composite sheet after drying. A single-layer sheet (resin sheet) can also be obtained without using a support by supplying a solution of the above resin composition in this embodiment dissolved in a solvent into a mold having a sheet-shaped cavity, and drying the solution, or the like for molding into a sheet shape.

In fabrication of the single-layer or laminated sheet in this embodiment, the drying conditions when the solvent is removed are not particularly limited but are preferably a temperature of 20° C. to 200° C. for 1 to 90 minutes because at low temperature, the solvent is likely to remain in the resin composition, and at high temperature, curing of the resin composition proceeds. In addition, the thickness of the resin layer of the single-layer or laminated sheet in this embodiment can be adjusted by the concentration and coating thickness of the solution of the resin composition in this embodiment and is not particularly limited but is preferably 0.1 to 500 μm because generally, when the coating thickness increases, the solvent is likely to remain during drying.

EXAMPLES

This embodiment will be described in more detail below by showing Synthesis Examples, Examples, and Comparative Examples, but this embodiment is not limited to these.

Synthesis Example 1

Synthesis of Cyanate Compound 1 of Hydroxyl Group-Containing Aromatic Compound (Following General Formula (5)) Obtained by Polycondensing Aromatic Alcohol, Aromatic Aldehyde Compound, and Aralkyl Compound

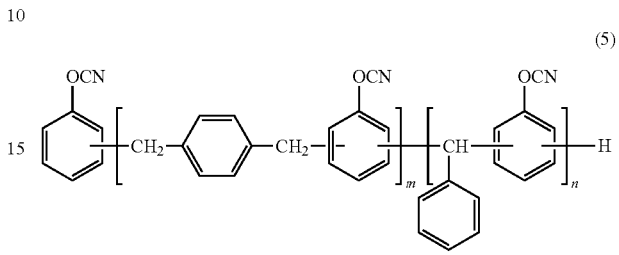

(5)

wherein m was 1, whereas n was 1.4.

370 g of a hydroxyl group-containing aromatic compound 1 represented by formula (6) (manufactured by AIR WATER INC., SK HE510, OH group equivalent 151 g/eq.) and 372.1 g (3.68 mol) (1.5 mol based on 1 mol of hydroxy groups) of triethylamine were dissolved in 2280 g of dichloromethane, and this solution was a solution 1.

While 334.6 g (5.44 mol) (2.2 mol based on 1 mol of hydroxy groups) of cyanogen chloride, 780.8 g of dichloromethane, 523.2 g (5.17 mol) (2.1 mol based on 1 mol of hydroxy groups) of 36% hydrochloric acid, and 3233.4 g of water were stirred, and the liquid temperature was kept at −2 to −0.5° C., the solution 1 was poured over 50 minutes. After completion of pouring of the solution 1, the mixture was stirred at the same temperature for 30 minutes, and then a solution of 297.7 g (2.94 mol) (1.2 mol based on 1 mol of hydroxy groups) of triethylamine dissolved in 298 g of dichloromethane (solution 2) was poured over 30 minutes. After completion of pouring of the solution 2, the mixture was stirred at the same temperature for 30 minutes to complete the reaction.

Then, the reaction liquid was allowed to stand to separate the organic phase and the aqueous phase. The obtained organic phase was washed six times with 2000 g of water. The electrical conductivity of the wastewater from the fifth water washing was 20 μS/cm, and it was confirmed that removable ionic compounds were sufficiently removed by the washing with water.

The organic phase after the water washing was concentrated under reduced pressure and finally concentrated to dryness at 90° C. for 1 hour to obtain 410 g of the target cyanate compound 1 represented by general formula (5) (brown viscous material). The number average molecular weight Mn of the obtained cyanate compound 1 was 364.

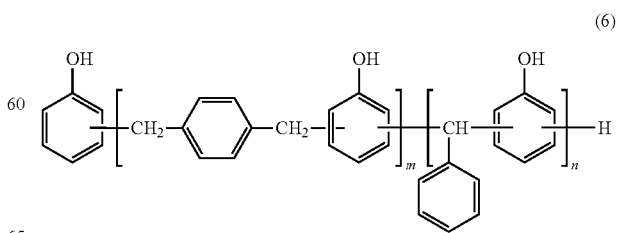

(6)

wherein m was 1, whereas n was 1.1.

Synthesis Example 2

Synthesis of Cyanate Compound 2 of Hydroxyl Group-Containing Aromatic Compound (Following General Formula (7)) Obtained by Polycondensing Aromatic Alcohol, Aromatic Aldehyde Compound, and Aralkyl Compound

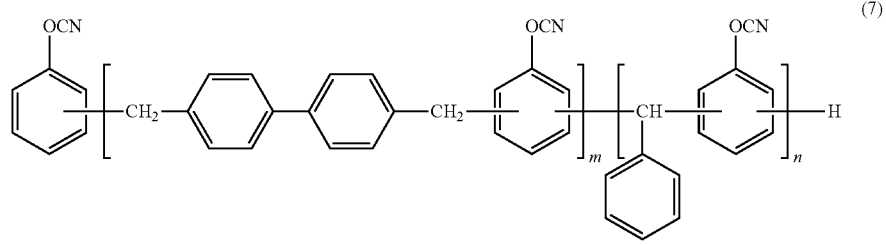

(7)

wherein m was 1, whereas n was 1.2.

440 g of the target cyanate compound 2 represented by general formula (7) (brown viscous material) was obtained as in Synthesis Example 1 except that 450 g of a hydroxyl group-containing aromatic compound 2 represented by formula (8) (manufactured by AIR WATER INC., SK HE610, OH group equivalent 184 g/eq.) was used instead of the hydroxyl group-containing aromatic compound 1 represented by formula (6). The number average molecular weight Mn of the obtained cyanate compound 2 was 377.

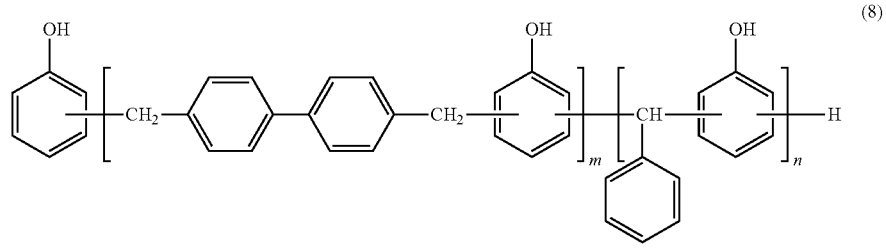

(8)

wherein m was 1, whereas n was 0.9.

Example 1

50 parts by mass of the cyanized ester resin represented by general formula (5) obtained by Synthesis Example 1, 50 parts by mass of a biphenyl aralkyl-based epoxy resin (NC-3000-FH, manufactured by Nippon Kayaku Co., Ltd.), 100 parts by mass of fused silica (SC2050 MB, manufactured by Admatechs Company Limited), and 0.05 parts by mass of zinc octylate (manufactured by Nihon Kagaku Sangyo Co., Ltd.) were mixed to obtain a varnish. This varnish was diluted with methyl ethyl ketone, and an E-glass woven fabric having a thickness of 0.1 mm was impregnated and coated with the diluted varnish and heated and dried at 150° C. for 5 minutes to obtain a prepreg having a resin content of 50% by mass.

Eight of the obtained prepregs were stacked, and 12 µm thick electrolytic copper foil (JDLCN, manufactured by JX NIPPON MINING & METALS CORP.) was disposed on the top and the bottom. The stack was laminate-molded at a pressure of 30 kgf/cm² and a temperature of 220° C. for 120 minutes to obtain a metal foil-clad laminate having an insulating layer thickness of 0.8 mm. Evaluation of the water absorption rate, heat resistance after moisture absorption, and flame retardancy was performed using the obtained metal foil-clad laminate. The results are shown in Table 1.

Example 2

A metal foil-clad laminate having a thickness of 0.8 mm was obtained as in Example 1 except that 50 parts by mass of the cyanized ester resin represented by general formula (7) was used instead of using the cyanized ester resin represented by general formula (5) in Example 1. The evaluation results of the obtained metal foil-clad laminate are shown in Table 1.

(Measurement Methods and Evaluation Methods)

1) Water Absorption Rate:

The water absorption rate after treatment at 121° C. and 2 atmospheres by a pressure cooker tester (manufactured by HIRAYAMA MANUFACTURING CORPORATION, model PC-3) for 5 hours was measured in accordance with JIS C648 using a 30 mm×30 mm metal foil-clad laminate sample.

2) Heat Resistance after Moisture Absorption:

All the copper foil of a 50 mm×50 mm metal foil-clad laminate sample except half of the copper foil on one surface was removed by etching to obtain a test piece. This test piece was treated at 121° C. and 2 atmospheres by a pressure cooker tester (manufactured by HIRAYAMA MANUFACTURING CORPORATION, model PC-3) for 5 hours and then immersed in solder at 260° C. for 60 seconds. Then, appearance change was visually observed. (the number of occurrences of blistering/the number of tests)

3) Flame Retardancy:

All of the copper foil of a 13 mm×130 mm metal foil-clad laminate sample was removed by etching to obtain a test piece. A flame resistance test was carried out in accordance with the UL94 vertical test method using this test piece (n=5).

Comparative Example 1

A metal foil-clad laminate having a thickness of 0.8 mm was obtained as in Example 1 except that 50 parts by mass of a bisphenol A-based cyanate compound (CA210, manufactured by MITSUBISHI GAS CHEMICAL COMPANY, INC.) and 0.03 parts by mass of zinc octylate were used instead of using the cyanized ester resin represented by formula (5) in Example 1. The evaluation results of the obtained metal foil-clad laminate are shown in Table 1.

Comparative Example 2

A metal foil-clad laminate having a thickness of 0.8 mm was obtained as in Example 1 except that 50 parts by mass of a phenol novolac-based cyanate compound (Primaset PT-30, manufactured by Lonza Japan Ltd.) and 0.04 parts by mass of zinc octylate were used instead of using the cyanized ester resin represented by formula (5) in Example 1, and heating and drying was performed at 165° C. for 4 minutes during impregnation and coating. The evaluation results of the obtained metal foil-clad laminate are shown in Table 1.

TABLE 1

|  |  | Example 1 | Example 2 | Comparative Example 1 | Comparative Example 2 |
|---|---|---|---|---|---|
| Water absorption rate (%) | After treatment for 5 hours | 0.34 | 0.37 | 0.38 | 0.52 |
| Heat resistance after moisture absorption | After treatment for 5 hours | 0/4 | 0/4 | 3/4 | 1/4 |
| Flame retardancy |  | V-0 | V-0 | V-1 | V-1 |

As is clear from Table 1, it was confirmed that by using the resin composition in this embodiment, a prepreg, a printed wiring board, and the like that not only had low water absorbency but also had excellent heat resistance after moisture absorption and flame retardancy were realized.

This application is based on Japanese Patent Application No. 2014-019555 filed with the Japan Patent Office on Feb. 4, 2014, the contents of which are incorporated herein by reference.

INDUSTRIAL APPLICABILITY

As described above, the resin composition in this embodiment can be widely and effectively used in various applications such as electrical and electronic materials, machine tool materials, and aviation materials, for example, as electrical insulating materials, semiconductor plastic packages, sealing materials, adhesives, lamination materials, resists, and buildup laminate materials, and, particularly, can be especially effectively used as printed wiring board materials adapted to higher integration and higher density for information terminal equipment, communication equipment, and the like in recent years. In addition, the laminate, metal foil-clad laminate, and the like of the present invention not only have low water absorbency but have performance also excellent in heat resistance after moisture absorption and flame retardancy, and therefore their industrial practicality is extremely high.

The invention claimed is:

1. A resin composition for a printed wiring board comprising:
   a cyanate compound (A) represented by following general formula (1); and
   an epoxy resin (B),

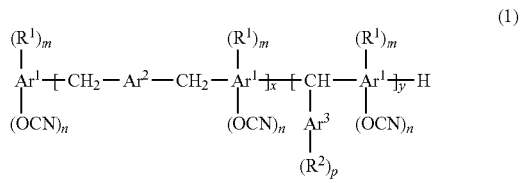

wherein $Ar^1$ represents an aryl group, $Ar^2$ each independently represents a divalent substituent selected from the group consisting of a phenylene group, a naphthylene group, and a biphenylene group, $Ar^3$ each independently represents a p+1-valent substituent selected from the group consisting of a p+1-valent phenyl group, a p+1-valent naphthyl group, and a p+1-valent biphenyl group, $R^1$ each independently represents a monovalent substituent selected from the group consisting of a hydrogen atom, an alkyl group, and an aryl group, $R^2$ each independently represents a monovalent substituent selected from the group consisting of a hydrogen atom, an alkyl group, an aryl group, and a cyanato group, n represents number of cyanato groups bonded to $Ar^1$ and is an integer of 1 to 3, m represents number of $R^1$ bonded to $Ar^1$, n+m+2 is equal to or less than number of possible bonds to $Ar^1$, p represents number of $R^2$ bonded to $Ar^3$ and is an integer of 1 to 9, x and y represent a ratio of repeating units, x is 1, whereas y is 0.25 to 2.0, and the repeating units for x and y may each be continuously arranged or may be alternately or randomly arranged with each other.

2. The resin composition for the printed wiring board according to claim 1, wherein $Ar^1$ comprises an m+n+1-valent or m+n+2-valent phenyl group or an m+n+1-valent or m+n+2-valent biphenyl group,
   $Ar^2$ comprises a phenylene group or a biphenylene group, and
   $Ar^3$ comprises a p+1-valent phenyl group or a p+1-valent biphenyl group.

3. The resin composition for the printed wiring board according to claim 1, wherein $Ar^1$ comprises an m+n+1-valent or m+n+2-valent phenyl group,
   $Ar^2$ comprises a phenylene group, and
   $Ar^3$ comprises a p+1-valent phenyl group.

4. The resin composition for the printed wiring board according to claim 1, wherein $Ar^1$ comprises an m+n+1-valent or m+n+2-valent phenyl group,
   $Ar^2$ comprises a biphenylene group, and
   $Ar^3$ comprises a p+1-valent phenyl group.

5. The resin composition for the printed wiring board according to claim 1, wherein a content of the cyanate compound (A) is 1 to 90 parts by mass based on 100 parts by mass of resin solids in the resin composition for a printed wiring board.

6. The resin composition for the printed wiring board according to claim 1, further comprising a filler (C).

7. The resin composition for the printed wiring board according to claim 6, wherein a content of the filler (C) is 50 to 1600 parts by mass based on 100 parts by mass of the resin solids in the resin composition for a printed wiring board.

8. The resin composition for the printed wiring board according to claim 1, further comprising one or more compounds selected from the group consisting of a cyanate compound (D) other than the cyanate compound (A), a maleimide compound (E), and a phenolic resin (F).

9. The resin composition for the printed wiring board according to claim 1, wherein the epoxy resin (B) comprises one or more epoxy resins selected from the group consisting of a biphenyl aralkyl-based epoxy resin, a naphthylene ether-based epoxy resin, a polyfunctional phenol-based epoxy resin, and a naphthalene-based epoxy resin.

10. A prepreg comprising:
a base material; and
the resin composition for the printed wiring board according to claim 1 with which the base material is impregnated or coated.

11. A metal foil-clad laminate comprising:
a laminate of at least one or more of the prepregs according to claim 10 stacked; and
a metal foil disposed on one surface or both surfaces of the laminate.

12. A resin composite sheet comprising:
a support; and
the resin composition according to claim 1 applied and dried on a surface of the support.

13. A printed wiring board comprising:
an insulating layer comprising the resin composition according to claim 1; and
a conductor layer formed on a surface of the insulating layer.

* * * * *